United States Patent
Petrosky et al.

(10) Patent No.: US 9,857,822 B2
(45) Date of Patent: Jan. 2, 2018

(54) CONTROL SYSTEM WITH ALWAYS ON CALIBRATION AND TEST AND CALIBRATION AND TEST CIRCUIT

(71) Applicants: Russell M. Petrosky, Endicott, NY (US); Stephen J. Gabaly, Apalachin, NY (US); Patrick Nee, Clarks Summitt, PA (US)

(72) Inventors: Russell M. Petrosky, Endicott, NY (US); Stephen J. Gabaly, Apalachin, NY (US); Patrick Nee, Clarks Summitt, PA (US)

(73) Assignee: BAE Systems Controls Inc., Endicott, NY (US)

( * ) Notice: Subject to any disclaimer, the term of this patent is extended or adjusted under 35 U.S.C. 154(b) by 182 days.

(21) Appl. No.: 14/884,373

(22) Filed: Oct. 15, 2015

(65) Prior Publication Data

US 2016/0109897 A1 Apr. 21, 2016

Related U.S. Application Data

(60) Provisional application No. 62/064,215, filed on Oct. 15, 2014.

(51) Int. Cl.
*G05F 3/08* (2006.01)
*G01R 35/00* (2006.01)

(52) U.S. Cl.
CPC .............. *G05F 3/08* (2013.01); *G01R 35/007* (2013.01)

(58) Field of Classification Search
CPC .......................... G01R 35/007; G05F 3/08
See application file for complete search history.

(56) References Cited

U.S. PATENT DOCUMENTS

2007/0040728 A1* 2/2007 Nishimura ............ G01S 13/345
342/70
2008/0224665 A1* 9/2008 Matsumoto ........ G01R 31/3648
320/134

* cited by examiner

*Primary Examiner* — Jermele M Hollington
*Assistant Examiner* — Feba Pothen
(74) *Attorney, Agent, or Firm* — Scully Scott Murphy & Presser PC; Scott J. Asmus

(57) ABSTRACT

A continuous, always on, high accuracy AC reference signal is added to an AC voltage of interest to calibrate the AC voltage of interest. The AC reference voltage has a first frequency. The AC voltage of interest has a second frequency. A control system having calibration.

17 Claims, 8 Drawing Sheets

CONTROL SYSTEM WITH ALWAYS ON CALIBRATION AND TEST AND CALIBRATION AND TEST CIRCUIT

CROSS-REFERENCE TO RELATED APPLICATIONS

This application claims the benefit under 35 U.S.C. §119 (e) of U.S. Provisional Application Ser. No. 62/064,215, filed Oct. 15, 2014. The entire contents and disclosure of the aforementioned provisional application is incorporated by reference as if fully set forth herein.

BACKGROUND OF THE DISCLOSURE

Field of the Disclosure

The present disclosure relates to monitoring an output of a device such as a sensor, and calibrating acquisition circuitry. The present disclosure also relates to a system of controlling downstream component(s) or part(s) using the output of the device and acquisition circuitry.

Background

AC signals can be used to convey information. This information is extracted using acquisition circuitry. However, in order to achieve accurate extraction, expensive high tolerance components or factory calibration with on board memory to store and use results during processing are typically used.

SUMMARY

Disclosed are a system and a method for calibrating acquisition circuitry. A continuous, always on, high accuracy AC reference signal is added to an AC voltage of interest.

In an aspect of the disclosure, a system includes an AC reference voltage generating circuit configured to generate an AC reference voltage having a first frequency. The AC reference voltage is added to the AC voltage of interest. The AC voltage of interest has a second frequency different from the first frequency. Additionally, a DC bias can be added. In an aspect of the disclosure, the system also includes a signal conditioning circuit configured to adjust the amplitude of the added AC voltages by an adjustment amount.

In another aspect of the disclosure, the system further includes an A/D converter configured to convert the added AC voltages to digital signals. The A/D converter can have certain input voltage requirements; therefore, the signal conditioning circuit can control the input voltage to the A/D converter by applying, for example, a gain and/or an offset. The system further includes a processor (or other computational element) configured to execute a first discrete fourier transform of the digital signals at the first frequency corresponding to the reference AC voltage and a second discrete fourier transform of the digital signals at the second frequency corresponding to the AC voltage of interest. The processor is configured to determine a calibrated output based on the first discrete fourier transform and the second discrete fourier transform.

Also disclosed is a control system comprising a plurality of sensors, an AC reference generating circuit, a plurality of calibration circuits and a processor. Each of the plurality of sensors outputs an AC voltage indicative of a sensed value. The AC voltage has a first frequency.

The AC reference generating circuit outputs an AC reference voltage having a second frequency.

The calibration circuit and sensor have a one-to-one relationship. Each of the plurality of calibration circuits receives the AC reference voltage from the AC reference generating circuit.

The calibration circuit comprises an adding circuit, a signal condition circuit and an A/D converter. The adding circuit adds the AC reference voltage to the AC voltage output from a respective one of the plurality of sensors. The adding circuit includes a first resistor having a first end coupled to the AC reference voltage and a second resistor having a first end coupled to the AC voltage. A second end of the first resistor is coupled to a second end of the second resistor. A bias voltage is added to the AC reference voltage and the AC voltage to generate an added AC voltage.

The signal condition circuit adjusts the amplitude of the added AC voltage by an adjustment amount.

The A/D converter converts the adjusted AC voltage to digital signals.

The processor is coupled to each of the plurality of calibration circuits. The processor determines a calibrated output value associated with each of the plurality of sensors based on the digital signals received from each of the plurality of calibration circuits and determines at least one control parameter based at least on the calibrated output, from at least one of the plurality of calibration circuits for controlling a downstream component.

BRIEF DESCRIPTION OF THE DRAWINGS

Aspects of the disclosure are further described with reference to the following drawings wherein.

DETAILED DESCRIPTION

Figure 1:
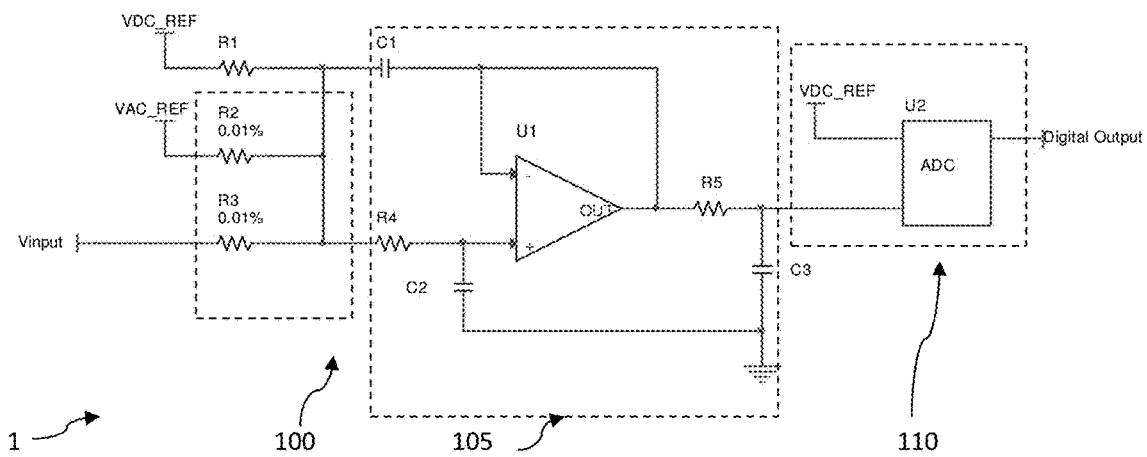
FIG. 1 illustrates a calibration circuit and acquisition circuitry in accordance with aspects of the disclosure.

Referring to FIG. 1, there is shown a calibration circuit 1. Also shown in FIG. 1 is acquisition circuitry. Advantageously, in accordance with aspects of the disclosure, most of the circuit components of the calibration circuit 1 and the acquisition circuitry are the same. Therefore, the calibration described herein is achieved without adding many circuit components and increasing cost.

Figure 8:
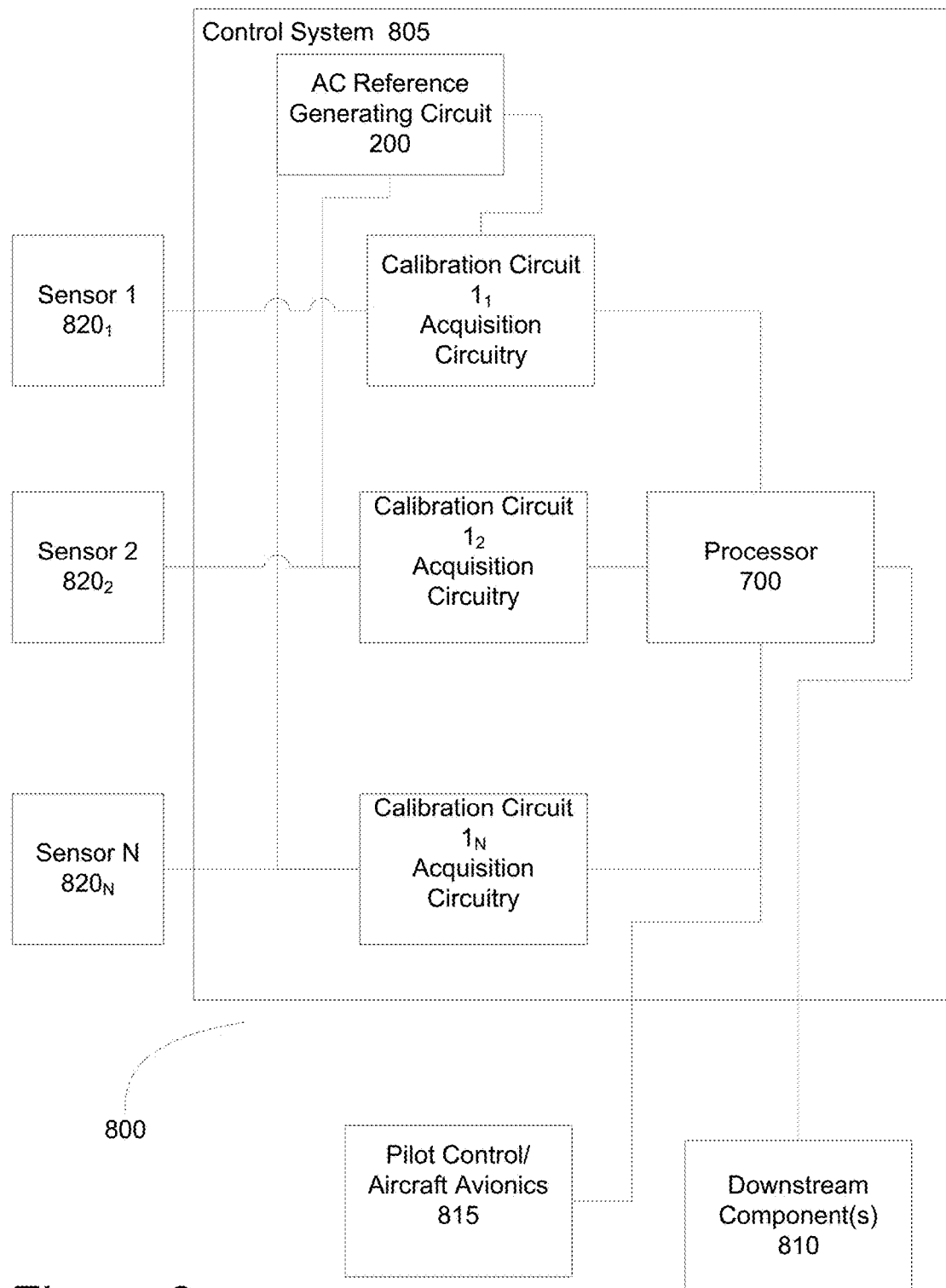
FIG. 8 illustrates a high level block diagram of a control system having calibration in accordance with aspects of the disclosure.

A plurality of calibration circuits for the acquisition circuitry can be used as part of a Full Authority Digital Engine Control (FADEC) system or a flight control system, an example of a control device for either such system is depicted as a block diagram in FIG. 8. One calibration circuit is used for the output of each sensor (acquisition circuitry). The output of the sensor is identified in FIG. 1 as Vinput. The calibration circuit 1 includes three stages: an adding stage, a signal conditioning stage and an A/D conversion stage. The calibration circuit 1 functions to scale in amplitude an AC input signal (Vinput), an AC reference signal, add the same together, scale and offset the combined signal to meet a voltage input requirement of an A/D converter and filter the combined signal (low pass/anti-aliasing). The acquisition circuitry includes the signal conditioning stage and the A/D conversion stage. Additionally, the acquisition circuitry includes resistor R3.

The adding stage of the calibration circuit 1 includes an adding circuit 100. The adding circuit 100 adds an AC input signal under testing (Vinput) with a precision AC reference signal (VAC_REF). The VAC_REF will be described later with respect to FIG. 2.

The adding circuit 100 includes at least two resistors R2 and R3. These resistors are precision resistors. For example, as depicted in FIG. 1, the resistors have a tolerance of 0.01%. However, the disclosure is not limited to this tolerance. Other precision resistors can be used. However, the resistors should have a tolerance that is equal. One end of the resistor R2 is coupled with the VAC_REF. One end of the resistor R3 is coupled with Vinput. The other ends of the resistors R2 and R3, respectively, are connected to each other to add the voltages. Also shown in FIG. 1 is a DC reference voltage VDC_REF which is used to generate a DC bias voltage. In an aspect of the disclosure, the DC bias voltage is also added to the combined VAC_REF and Vinput. While FIG. 1 depicts a DC bias being added to the combination of the VDC_REF and Vinput (through R2 and R3), a DC bias voltage is not required. When the DC bias voltage is included, the VDC_REF is coupled to one end of resistor R1.

The signal conditioning stage includes a signal conditioning circuit 105. The signal condition circuit 105 serves to filter the combined voltages, remove aliasing and also adjust the amplitude of the combined voltages. The amount of adjustment needed will depend on the type of A/D converter (ADC), e.g., U2. An ADC has a given operational range. The signal conditioning circuit 105 applies a gain to the combined voltages. This gain is typically a negative gain as the combined voltages will generally be higher than the operational range of the ADC. The values of the resistors determine the respective gain of the VDC_REF, Vinput and DC bias voltage (R1-R3).

As depicted in FIG. 1, the ADC U2 is separate from the Processor 700. However, alternatively the ADC can be integrated into the Processor 700.

The signal conditioning circuit 105 can include Common of the shelf parts (COTS) with lower accuracy then the high precision resistors R2 and R3 as the effects of these components will be applied to both voltages and can therefore be compensated out afterwards in the digital domain.

As depicted in FIG. 1, the signal conditioning circuit 105 includes resistors R4 and R5, capacitors C1-C3 and an amplifier U1.

The output of the signal conditioning circuit is applied as the input to the ADC (U2) 110. Additionally, the ADC is feed the VDC_REF. This is the same VDC_REF as used to generate the DC bias voltage. The ADC outputs digital signals for further processing by a Processor 700.

Figure 2:
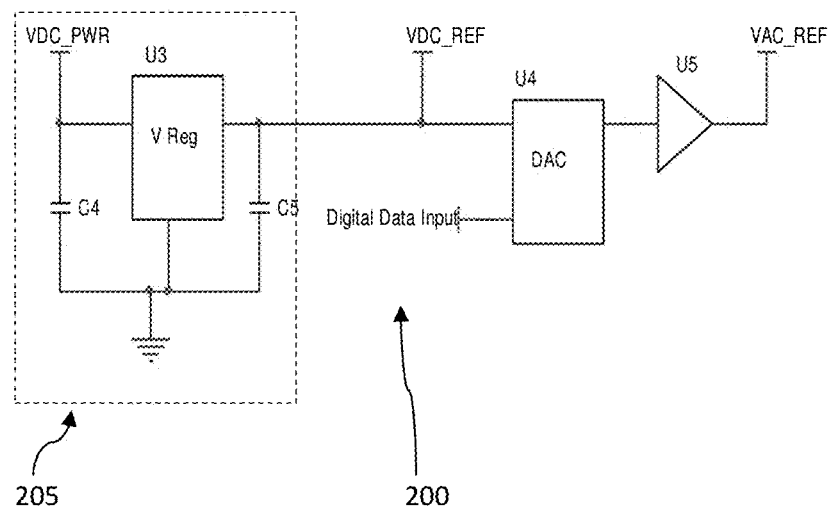
FIG. 2 illustrates an AC reference voltage circuit in accordance with aspects of the disclosure.

Referring to FIG. 2, there is shown an AC reference voltage generating circuit 200 in accordance with aspects of the disclosure. When there is a plurality of calibration circuits 1 in a control system, the same AC reference voltage generating circuit 200 generates the reference voltage for all of the calibration circuits. Each calibration circuit 1 is coupled to the output of the AC reference voltage generating circuit.

The AC reference voltage generating circuit 200 includes a power supply stage 205, a D/A converter (DAC) identified as U4 and buffer U5. The power supply stage 205 is identified by the dashed lines. In an aspect of the disclosure, the power supply stage can be an on-board standard power supply circuit included in a control system. The power supply stage supplies the VDC_REF. This is the same voltage as used to generate the DC bias voltage and that is supplied to the ADC (in FIG. 1).

A precision VAC_REF can be generated for a specified frequency. The specified frequency is controlled by data input into the DAC. The frequency of the precision VAC_REF is different from the frequency of the Vinput (input signal under testing). The difference in the frequency of the VAC_REF and the frequency of the Vinput should be sufficient to avoid interference. The difference can be determined based on an accuracy requirement of the control system.

The precision VAC_REF is continuously applied and added to the Vinput.

The magnitude of the VAC_REF is also set. However, the magnitude can be varied as needed.

Figure 3:
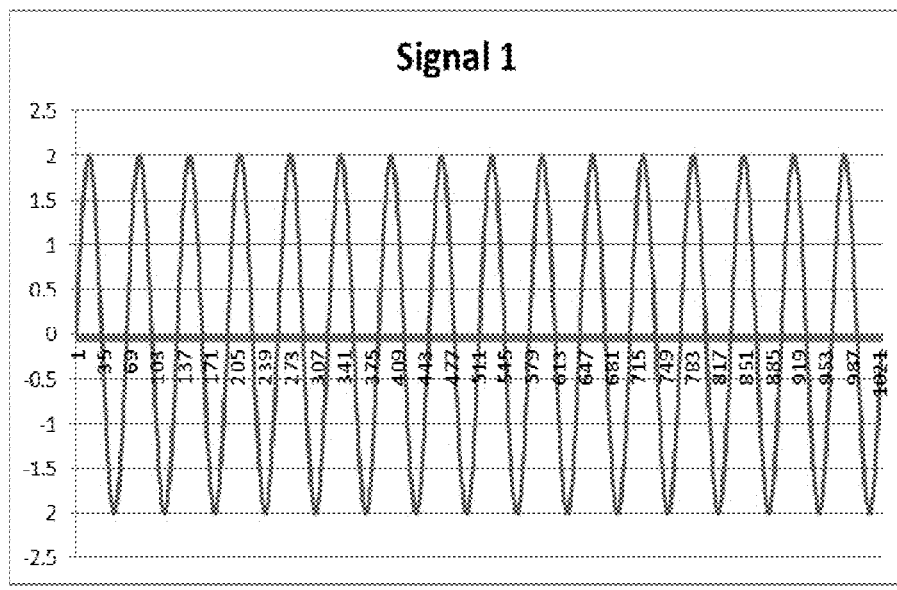
FIG. 3 illustrates an example of an AC input voltage under testing in accordance with aspects of the disclosure.

FIG. 3 illustrates an example of Vinput (labeled as Signal 1). As depicted, Vinput has amplitude of 2. The Vinput can be generated from a sensor such as a Variable Differential Transformer (VDT) sensor in a control system such as a flight control system or a FADEC. The Vinput depicted in FIG. 3 is a high frequency signal.

Figure 4:
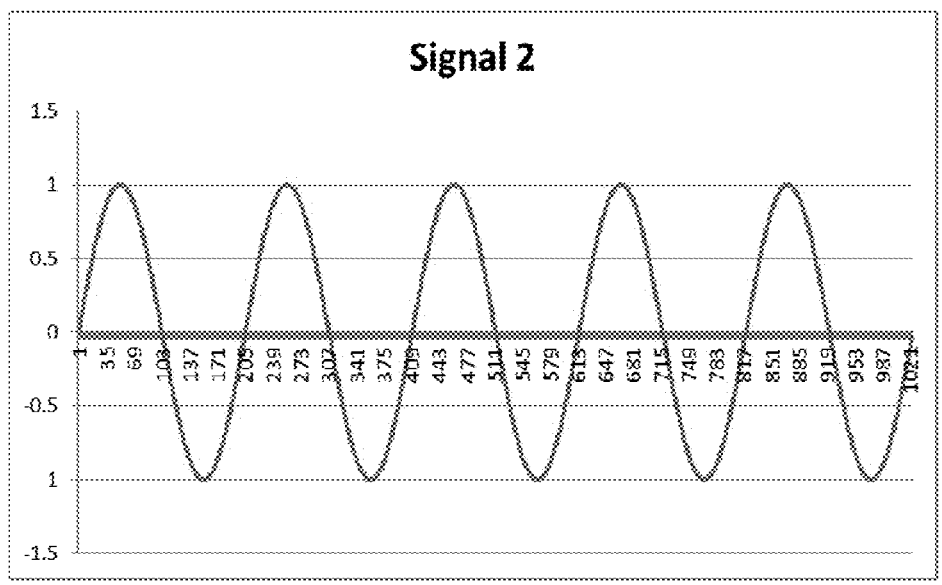
FIG. 4 illustrates an example of an AC reference voltage in accordance with aspects of the disclosure.

FIG. 4 is an example of an AC reference voltage (labeled as Signal 2) in accordance with aspects of the disclosure. As depicted, VAC_REF has amplitude of 1 and has a lower frequency than Vinput.

Figure 5:
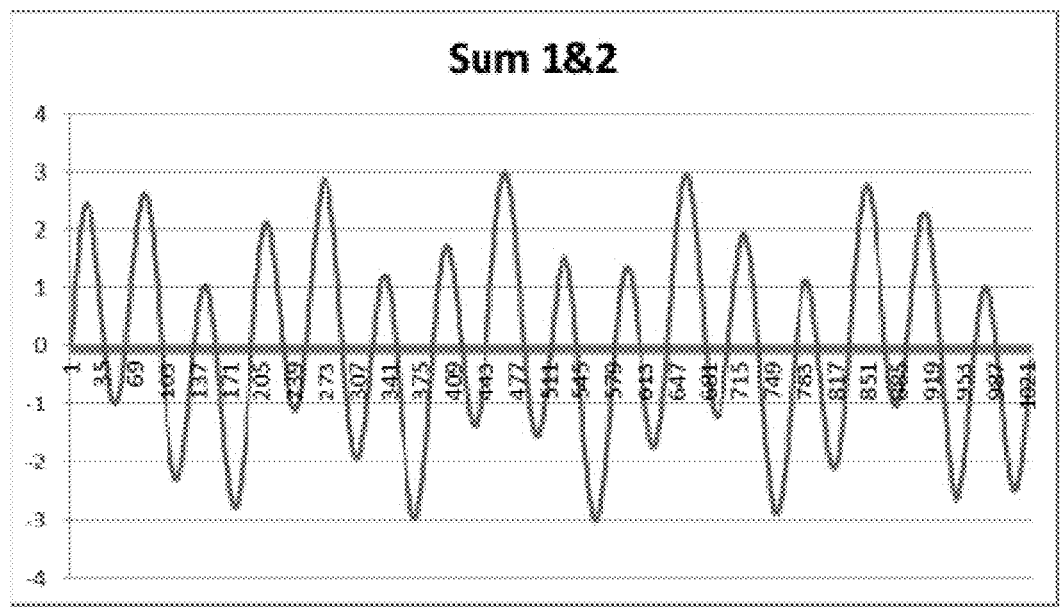
FIG. 5 illustrates an example of an added voltage of the AC input voltage and the AC reference voltage in accordance with aspects of the disclosure.

FIG. 5 is an example of the added voltages of the Vinput and VAC_REF (Sum 1 and Sum 2) in accordance with aspects of the disclosure. As depicted, the signal shown is after signal conditioning by the signal conditioning circuit (as input into the ADC).

Figure 6:
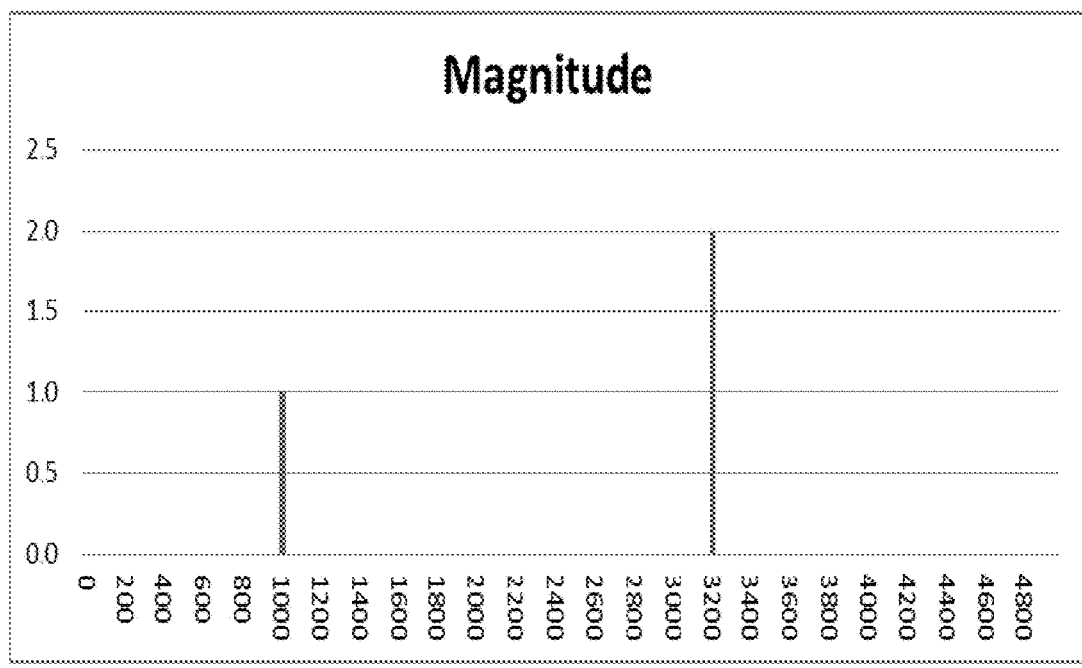
FIG. 6 illustrates an example of a post processed signal in accordance with aspects of the disclosure.

FIG. 6 is an example of the post-processed signal in accordance with aspects of the disclosure. FIG. 6 depicts two vertical lines: a first line around 1000 having a magnitude of 1 (representing VAC_REF) and a second line around 3200 having a magnitude of 2 (representing Vinput).

The output of the ADC is processed by the Processor 700.

Figure 7:
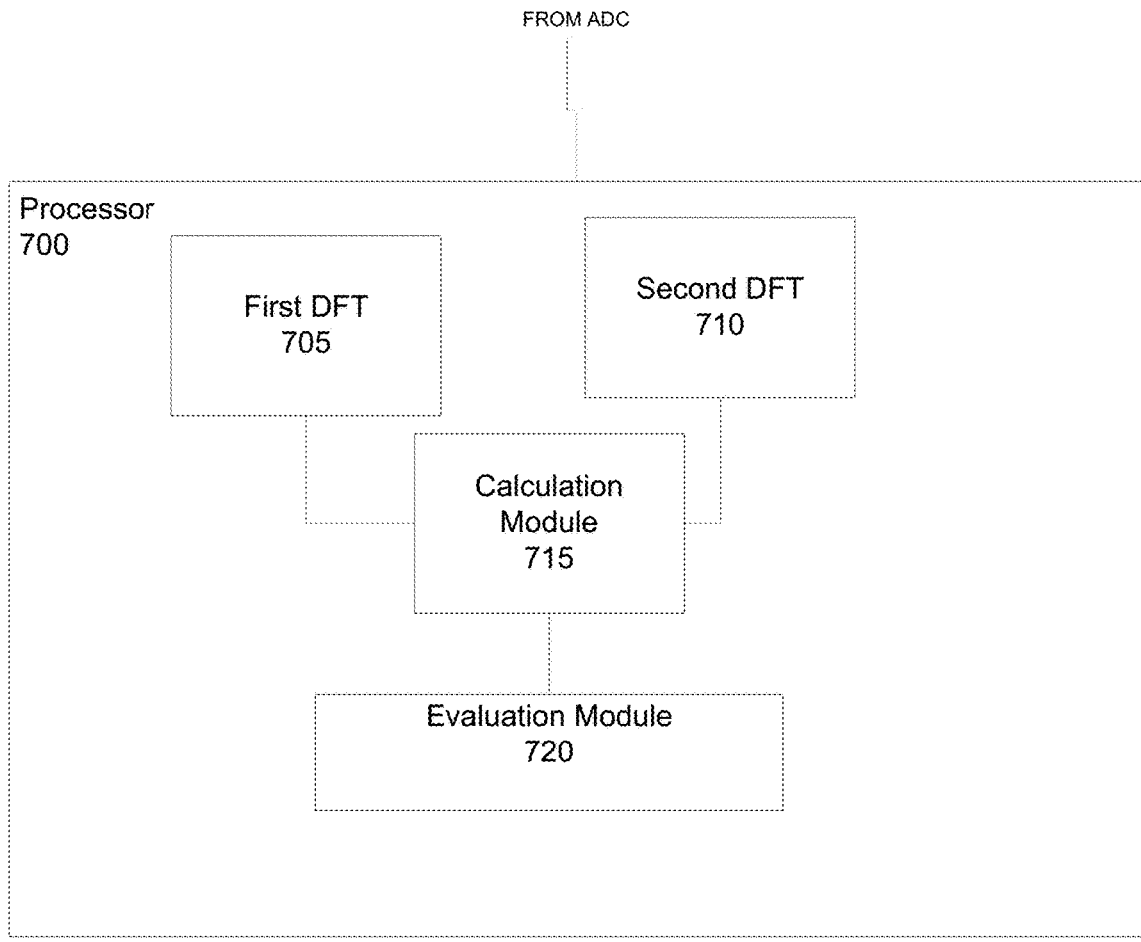
FIG. 7 illustrates a functional block diagram of a processor in accordance with aspects of the disclosure.

FIG. 7 illustrates a functional block diagram of the Processor 700. The Processor 700 can be a microcontroller. The microcontroller can be a part of a control system. The microcontroller can be the same microcontroller that is used to control downstream components such as an engine or aircraft surfaces. The block diagram showing in FIG. 7 shows functions associated with the calibration and fault detection. However, if the Processor used to control at least one downstream component is the same Processor, the processor would include additional blocks. The Processor 700 can also be another computational element, such as, but not limited to an FPGA/System on Chip, etc.

The Processor 700 uses two DFT's 705 and 710 to separate each signal in the digital domain and the outcome from the VAC_REF is used to calibrate the acquisition circuitry.

The Processor 700 using a Calculation Module 715 determines the calibrated output amplitude as follows:

Calibrated Output Amplitude=
((DftMagInputSignal*ReferenceVoltageSetPoint*
NominalRefGain)/(DftMagReferenceSignalAve*
NominalInputGain)). (Equation 1).

Equation 1 is determined as follows.

$$\frac{\text{Expected Signal}}{\text{Measured Signal}} = \frac{\text{Expected Reference}}{\text{Measured Reference}} \quad \text{(Equation 2)}$$

It is assumed that the ratio of expected verses measured values for both the VAC_REF and Vinput is the same.

$$\frac{(CalibratedOutputAmplitde)}{\frac{(NominalInputGain)}{(DftMagInputSignal)}} = \frac{(ReferenceVoltageSetPoint)}{\frac{(NominalRefGain)}{(DftMagReferenceSignalAve)}} \quad \text{(Equation 3)}$$

Solving for the Calibrated Output Amplitude, both sides is multiplied by:

$$\frac{(DftMagInputSignal)}{(NominalInputGain)} \quad \text{(Equation 4)}$$

DftMagInputSignal is the magnitude of the Vinput after discrete fourier transform. ReferenceVoltageSetPoint is the set or ideal amplitude of the VAC_REF. NominalRefGain is the gain applied to the VAC_REF by the signal conditioning circuit. DftMagReferenceSignalAve is the average of the magnitude of the VAC_REF after discrete fourier transform. The average is used to increase the precision of the calibration. Alternatively, in another aspect of the disclosure, the magnitude itself can be used. NominalInputGain is the gain applied to the Vinput by the signal conditioning circuit.

Any DC offset error induced either at the sensor or by the electronics reading the input is common and inherently rejected by design through the DFT operations leaving gain error which is addressed above.

FIG. 8 illustrates a high level block diagram of a control system 800 having calibration in accordance with aspects of the disclosure. If the control system 800 is for engine control or controlling flight controlled surfaces, the control system can have multiple redundant channels. For purposes of this description, FIG. 8 only depicts one channel. The Control Device 805 can be used in any control system where a control parameter is impacted or determined based on a sensor output. The Control Device 805 includes a plurality of Calibration Circuits 1 and acquisition circuits, an AC Reference Generating Circuit 200 and a Processor 700. As depicted in FIG. 8, the Calibration Circuit and Acquisition Circuitry are depicted in the same box since most of the circuit components are the same. These components are mounted to an Electronic Circuit Card (not shown). When the Control Device 805 has multiple channels, the components for each channel are mounted on a separate Electronic Circuit Card, where each Electronic Circuit Card has the same components. Therefore, each Electronic Circuit Card includes the hardware for controlling a downstream device 810, e.g., flight controlled surfaces, an engine and fluid valve or solenoid.

The multiple channels are provided for redundancy. If one of the channels is defective, the redundancy allows for the device to still be able to control a downstream device without interruption. In one aspect of the disclosure, one of the Electronic Circuit Cards, is set as the master card and the other is set as a standby card. If the master card fails, then the standby card takes over.

The Control Device 805 can communicate control parameters to downstream components 810, such as flight controlled surfaces, an Engine, fluid valves or solenoids. Additionally, the Control Device 805 can communicate bi-directionally with the Pilot Control/Aircraft Avionics 815. For example, the Control Device 805 can receive control commands from the Pilot Control/Aircraft Avionics such as commands for the flight controlled surfaces. Flight controlled surfaces discussed herein include Aileron, Elevator or Rudder. The Control Device 805 can also receive control commands from the Pilot Control/Aircraft Avionics for controlling Throttle. These commands can also be sensed using VDT Sensors in the Pilot Control/Aircraft Avionics.

The Control System 800 includes a plurality of Sensors 820. The Sensors 820 can be a VDT Sensor, RTD or Strain Gauge. Additionally, the Sensors 820 can be any sensor having an AC voltage output. In an aspect of the disclosure, the Sensors 820 monitor the actual position of Flight controlled surfaces such as the Aileron, Elevator and Rudder. Each Sensor reports its output to a respective Calibration Circuit/acquisition circuitry. For example, Sensor 1 reports its output to Calibration Circuit 1/acquisition circuitry and Sensor 2 reports its output to Calibration Circuit 2/acquisition circuitry.

The AC Reference Generating Circuit 200 is coupled to each of the Calibration Circuits 1 and supplies the AC Reference Signal to each of the plurality of Calibration Circuits.

When a Sensor 1 reports its output to the respective Calibration Circuit 1/acquisition circuitry, the AC output signal (Vinput as depicted in FIG. 1) is adjusted as described above and output from the Calibration Circuit 1/acquisition circuitry to the Processor 700 for analysis. The Processor 700 determines the Calibrated Output Amplitude associated with each sensor using Equation 1. Once the Calibrated Output Amplitude, associated with each sensor is determined, the Processor 700 uses the same to determine at least one control parameter for a downstream component 810 such as flight controlled surfaces, an Engine, fluid valves or solenoids For example, in an aspect of the disclosure, the Processor 700 compares a command position of a flight control surface received from the Pilot Control/Aircraft Avionics with the actual position of the flight control surface sensed by a Sensor 820. The difference between the commanded position and the actual position of the flight controlled surface is feedback into the control. For example, the Processor 700 can control the actual position of the flight control surface to move such that the position is substantially the same as the commanded position. The Processor 700 can similarly control a downstream component 810 based on a Throttle command received from the Pilot Control/Aircraft Avionics in combination with output from a sensor associated with an engine (pressure sensor etc), fluid valve or solenoid.

The Calibrated Output Amplitude provides a benefit to the Control System 800 though improved accuracy of the measurement, e.g., Flight Controlled Surfaces measurement. This in turn improves the feedback control over the downstream components 810 providing a higher degree of precision in controlling, e.g., the Flight Controlled Surfaces and ultimately resulting in improved flight metrics such as fuel economy and flight performance.

The Processor 700 also evaluates, using the Evaluation Module 720, the Calibrated Output Amplitude, the DftMag- InputSignal and the DftMagReferenceSignalAve for fault detection. In an aspect of the disclosure, the Processor 700 can determine whether there is a sensor error (or external wiring), an error in the AC Reference Generating Circuit or an error in the Calibration Circuit (acquisition circuitry).

If a value deviate from an expected range, the Evaluation Module 720 can set a fault flag and isolate the component(s) from the remaining portions of the system (e.g., out to isolate if the Processor 700 is different from a Processor which controls the downstream components or ignoring the output if the Processor 700 is the same as controlling the downstream components). Each Sensor 800 has an expected range of values, e.g., minimum value to maximum value. Similarly, the AC Reference signal also has an expected range of values.

When the DftMagInputSignal and the DftMagReferenceSignalAve are both within range, there are no problems.

When the DftMagInputSignal deviates from the expected range or the DftMagInputSignal is missing (i.e., approximately 0), and at the same time DftMagReferenceSignalAve is within range, then it is likely that there is a sensor error or a problem with a circuit pre-add point (as the failure rate only R3 would be small in comparison). The Evaluation Module 720 can set a sensor error flag. There is a high probability that the error is isolated to outside of the Control Device 805. The Sensor then can be taken offline and electrically isolated, e.g., the output associated with the sensor can be ignored. Additionally, if there are multiple channels in the Control Device 805, another channel (e.g., Electronic Circuit Card) can take over as the master channel, e.g., redundancy. For example, in one aspect of the disclosure, the channel (e.g., Electronic Circuit Card) can change from a standby status to an active status. The Processor 700 associated with the channel having a fault can transmit an error message to the processors in the other channels.

Additionally, when the DftMagReferenceSignalAve deviates from the expected range, or the DftMagReferenceSignalAve is missing (i.e., approximately 0) and at the same time DftMagInputSignal is within range, then it is likely an internal error isolated to an error with the precision AC reference generating circuit. The Evaluation Module 720 can set an AC reference voltage generating circuit error flag. In an aspect of the disclosure, the master channel can remain in an active status; however, the acquisition circuitry will no longer be calibrated. In another aspect of the disclosure, like above, another channel can take over as the master channel and change from standby status to an active status. The Processor 700 associated with the channel having a fault can transmit an error message to the processors in the other channels. The Processor 700 then can output a null signal.

Additionally, if both the DftMagReferenceSignalAve and the DftMagInputSignal are outside of their expected ranges or both missing (i.e., approximately 0) then it is likely an internal error isolated to circuitry common to both paths (e.g., Parts of FIG. 1 excluding R2 and R3). The evaluation Module 720 can set a signal acquisition circuit error flag, e.g., error in the circuit card. Additionally, in an aspect of the disclosure, the Processor 700 associated with the channel having a fault can transmit an error message to the processors in the other channels. In one aspect of the disclosure, another channel (e.g., Electronic Circuit Card) can take over as the master card and change from standby status to active.

In an aspect of the disclosure, the Processor 700 can transmit a notification to the Pilot Control indicative of the location of the error.

The above fault isolation provides benefits to the Control System 800 to improve detection and isolation of a faulted condition to either the acquisition circuitry which is part of the Control Device 805, the AC Reference Generating Circuit or to the sensor(s) and external wiring. This detection and isolation reduces incorrect maintenance actions such as unnecessary remove and replace operations. Thus, the above fault detection and notification shortens the overall maintenance time and improves the overall maintainability of the aircraft resulting in improved operational time and reduced maintenance and costs associated with down time.

Those skilled in the art will appreciate that aspects of the disclosure are an improvement over the prior art because existing solutions utilize high accuracy parts or factory calibration. This results in very expensive solutions with no inherent fault isolation. Also, prior calibrations are unable to replicate all life conditions/scenarios during a factory calibration.

Aspects of the disclosure provide an additional advantage of eliminating any circuitry needed to Switch-in a DC reference voltage to compensate.

The Processor 700 in each channel can be a microcontroller or microprocessor or any other processing hardware such as a CPU or GPU placed on a respective Electronic Circuit Card. The microcontroller or microprocessor includes at least one memory, such as, but not limited to, RAM, ROM and persistent storage. In an aspect of the disclosure, the Processor can be configured to execute one or more programs stored in a computer readable storage device. The computer readable storage device can be RAM, persistent storage or removable storage. A storage device is any piece of hardware that is capable of storing information, such as, for example without limitation, data, programs, instructions, program code, and/or other suitable information, either on a temporary basis and/or a permanent basis.

Various aspects of the present disclosure may be embodied as a program, software, or computer instructions embodied or stored in a computer or machine usable or readable medium, or a group of media which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device, may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electromagnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The terms "Processor" as may be used in the present disclosure may include a variety of combinations of hardware including a control circuit, hardware and software, and storage devices. The Processor may include a plurality of individual circuit components linked to perform collaboratively, or may include one or more stand-alone components.

While the present disclosure has been described in connection with embodiments of the various figures, it is to be understood that other similar embodiments may be used or modifications and additions may be made to the described embodiment for performing the same function of the present disclosure without deviating there from. Therefore, the present disclosure should not be limited to any single embodiment, but rather construed in breadth and scope in accordance with the recitation of the appended claims.

What is claimed is:

1. A system comprising:
   an AC reference voltage generating circuit configured to generate an AC reference voltage having a first frequency, wherein the AC reference voltage generating circuit comprises a D/A converter, and wherein the D/A converter receives an input DC voltage from an onboard DC power supply as a DC reference voltage and a frequency control signal, the frequency control signal controlling the first frequency;
   an adding circuit configured to add the AC reference voltage to an AC voltage output from a sensor, the AC voltage having a second frequency, the adding circuit including a first resistor having a first end coupled to the AC reference voltage, a second resistor having a first end coupled to the AC voltage, a second end of the first resistor is coupled to a second end of the second resistor, a bias voltage is added to the AC reference voltage and the AC voltage to generate an added AC voltage;
   a signal condition circuit configured to adjust an amplitude of the added AC voltage by an adjustment amount;
   an A/D converter configured to convert the adjusted AC voltage into digital signals; and
   a processor configured to execute a first discrete fourier transform of the digital signals at the first frequency corresponding to the reference AC voltage and a second discrete fourier transform of the digital signals at the second frequency corresponding to the AC voltage and configured to determine a calibrated output based on the first discrete fourier transform and the second discrete fourier transform.

2. The system of claim 1, wherein the first resistor and the second resistor have a tolerance of about 0.01%.

3. The system of claim 1, wherein the DC reference voltage is input into the A/D converter, and wherein the DC reference voltage is used to generate the bias voltage.

4. The system of claim 1, wherein the calibrated output is determined based on (a magnitude of the second discrete fourier transform of the digital signals*a reference voltage set point*gain amount)/(an average of a magnitude of the first discrete fourier transform of the digital signals*gain amount).

5. The system of claim 1, wherein the processor is further configured to determine at least one control parameter based at least on the calibrated output for controlling a downstream component.

6. The system of claim 5, wherein the processor is in a flight control system and the downstream component is a flight controlled surface.

7. The system of claim 1, wherein the processor is further configured to detect a fault and determine a location of the fault based on the magnitude of the second discrete fourier transform of the digital signals and an average of a magnitude of the first discrete fourier transform of the digital signals or the magnitude of the first discrete fourier transform of the digital signals, and generate a fault signal indicating a fault has occurred.

8. The system of claim 7, wherein when the magnitude of the second discrete fourier transform of the digital signals is outside an expected range or zero and the average of a magnitude of the first discrete fourier transform of the digital signals or the magnitude of the first discrete fourier transform of the digital signals is within a second expected range, the processor is configured to indicate that a fault has occurred with either the sensor or external circuitry.

9. The system of claim 7, wherein when the magnitude of the second discrete fourier transform of the digital signals is outside an expected range or zero and the average of a magnitude of the first discrete fourier transform of the digital signals or the magnitude of the first discrete fourier transform of the digital signals is outside a second expected range or zero, the processor is configured to indicate that a fault has occurred with a circuit on an internal circuit card of a control device.

10. The system of claim 7, wherein when the magnitude of the second discrete fourier transform of the digital signals is within an expected range and the average of a magnitude of the first discrete fourier transform of the digital signals or the magnitude of the first discrete fourier transform of the digital signals is outside a second expected range or zero, the processor is configured to indicate that a fault has occurred with the AC reference voltage generating circuit.

11. The system of claim 7, wherein the processor is further configured to isolate a circuit component associated with the fault.

12. A control system comprising:
   a plurality of sensors, each outputting an AC voltage indicative of a sensed value, the AC voltage having a first frequency;
   an AC reference generating circuit configured to output an AC reference voltage having a second frequency;
   a plurality of calibration circuits, one calibration circuit for a respective sensor, each of the plurality of calibration circuits receiving the AC reference voltage from the AC reference generating circuit, each calibration circuit comprising:
   an adding circuit configured to add the AC reference voltage to the AC voltage output from a respective one of the plurality of sensors, the adding circuit including a first resistor having a first end coupled to the AC reference voltage, a second resistor having a first end coupled to the AC voltage, a second end of the first resistor is coupled to a second end of the second resistor, a bias voltage is added to the AC reference voltage and the AC voltage to generate an added AC voltage;

a signal condition circuit configured to adjust an amplitude of the added AC voltage by an adjustment amount; and an A/D converter configured to convert the adjusted AC voltage into digital signals, and a processor coupled to each of the plurality of calibration circuits, the processor configured to determine a calibrated output value associated with each of the plurality of sensors based on the digital signals received from each of the plurality of calibration circuits and determine at least one control parameter based at least on the calibrated output, from at least one of the plurality of calibration circuits for controlling a downstream component.

13. The control system of claim 12, wherein the downstream component is at least one surface of flight controlled surfaces.

14. The control system of claim 12, wherein the processor is further configured to detect a fault and determine a location of the fault based on the digital signals received from each of the plurality of calibration circuits.

15. The system of claim 14, wherein the processor is further configured to isolate a circuit component associated with the fault.

16. The system of claim 14, wherein the processor is further to issue a notification to an avionics system indicating the determined location of the fault.

17. The system of claim 14, wherein the system is a multi-channel system, each channel including a processor, wherein one channel is active and other channels are standby, and wherein the processor in the active channel is further configured to issue a notification to a processor in the other channels indicating a fault.

* * * * *